United States Patent
Suzuki et al.

(10) Patent No.: US 6,894,943 B2
(45) Date of Patent: May 17, 2005

(54) SEMICONDUCTOR MEMORY DEVICE WHICH REDUCES THE CONSUMPTION CURRENT AT THE TIME OF OPERATION

(75) Inventors: Hideaki Suzuki, Kawasaki (JP); Masao Nakajima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/341,455

(22) Filed: Jan. 14, 2003

(65) Prior Publication Data

US 2003/0174573 A1 Sep. 18, 2003

(30) Foreign Application Priority Data

Mar. 13, 2002 (JP) ........................................ 2002-069065

(51) Int. Cl.[7] .............................................. G11C 8/00
(52) U.S. Cl. ............................. 365/230.03; 365/185.2; 365/189.01; 365/194; 365/205
(58) Field of Search ........................ 365/230.03, 189.01, 365/194, 185.2, 205

(56) References Cited

U.S. PATENT DOCUMENTS

| | | | |
|---|---|---|---|
| 4,800,530 A | | 1/1989 | Itoh et al. |
| 6,028,812 A | * | 2/2000 | Tanaka ................... 365/230.03 |
| 6,373,777 B1 | * | 4/2002 | Suzuki ................... 365/230.03 |
| 6,584,027 B2 | * | 6/2003 | Shinozaki .................... 365/205 |
| 2004/0085835 A1 | * | 5/2004 | Ahn et al. ................... 365/200 |

FOREIGN PATENT DOCUMENTS

| | | |
|---|---|---|
| JP | 63-050998 | 3/1988 |
| JP | 07-122065 | 5/1995 |

* cited by examiner

Primary Examiner—Richard Elms
Assistant Examiner—Tuan T. Nguyen
(74) Attorney, Agent, or Firm—Arent Fox PLLC

(57) ABSTRACT

A semiconductor memory device includes a memory bank which is divided into a plurality of memory blocks including a first memory block and a second memory block. A first sense amplifier control unit activates sense amplifiers connected with the first memory block, in response to a first activation signal. A second sense amplifier control unit activates sense amplifiers connected with the second memory block, in response to a second activation signal. A signal control unit outputs the first activation signal and the second activation signal to the first sense amplifier control unit and the second sense amplifier control unit, separately from each other, the signal control unit outputting the second activation signal to the second sense amplifier control unit by delaying the first activation signal by a predetermined time after the outputting of the first activation signal.

13 Claims, 11 Drawing Sheets

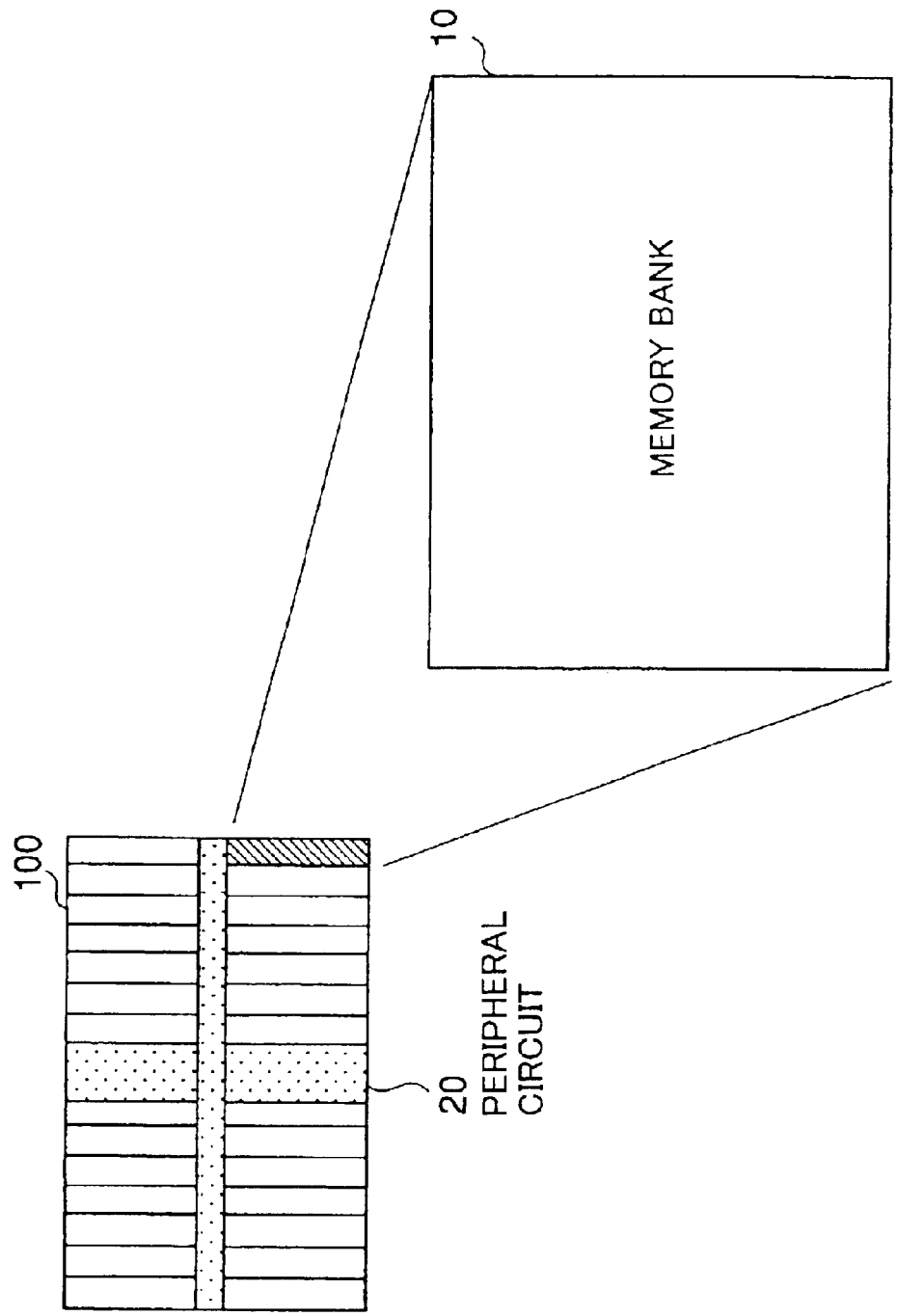

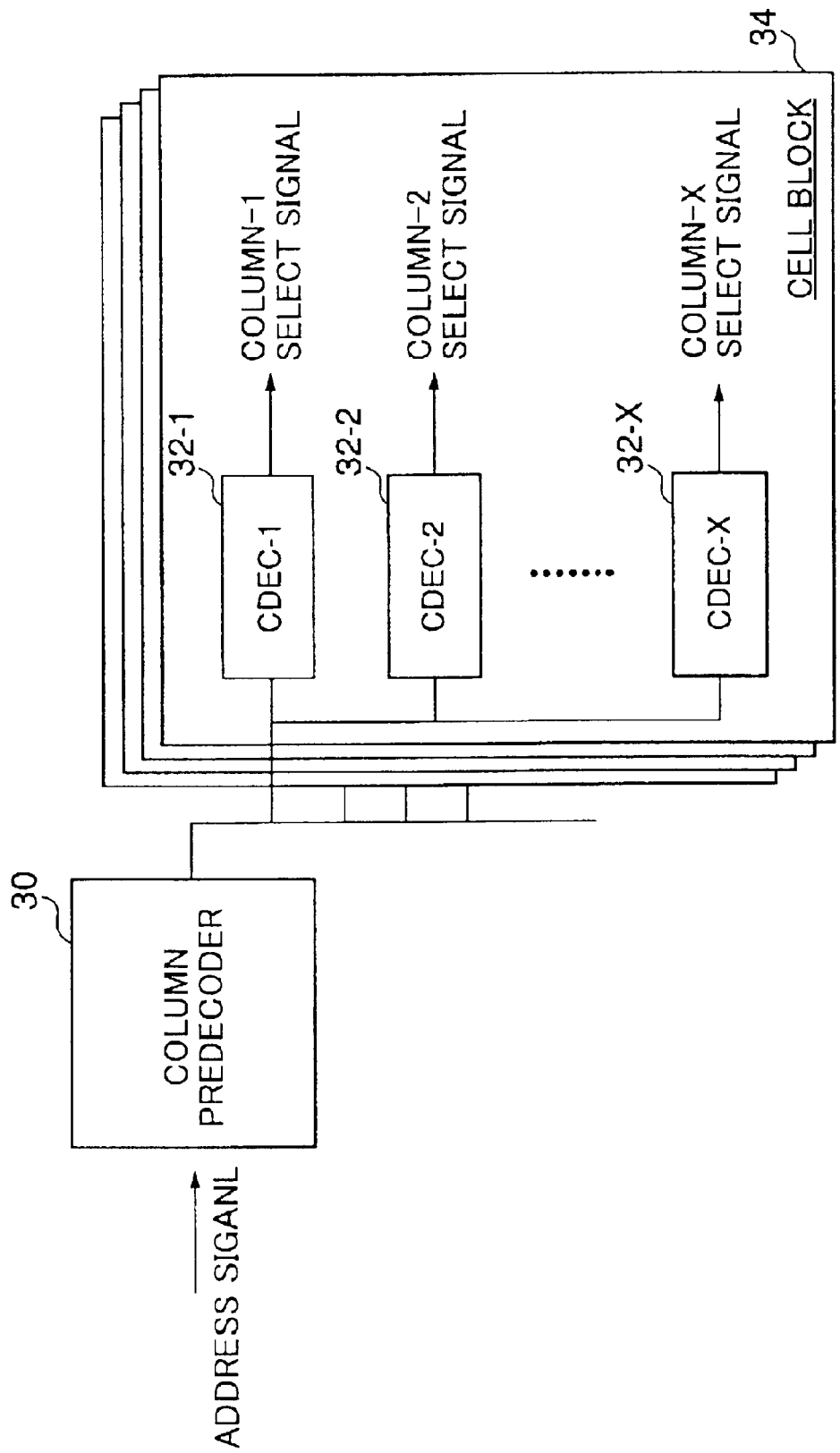

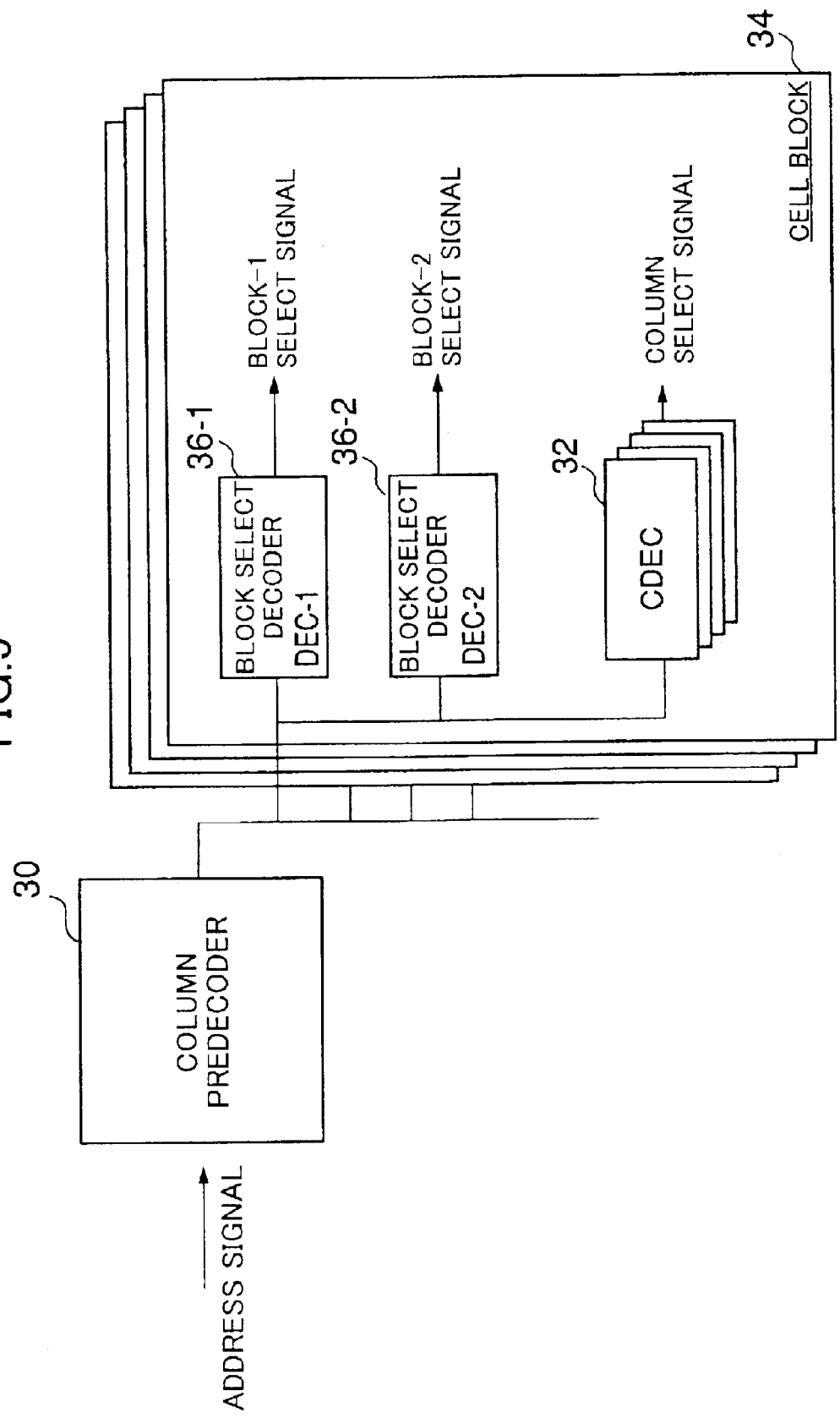

SEMICONDUCTOR MEMORY DEVICE WHICH REDUCES THE CONSUMPTION CURRENT AT THE TIME OF OPERATION

CROSS-REFERENCE TO RELATED APPLICATIONS

This application is based upon and claims the benefit of priority from the prior Japanese Patent Application No. 2002-069065, filed on Mar. 13, 2002, the entire contents of which are hereby incorporated by reference.

BACKGROUND OF THE INVENTION

1. Field of the Invention

The present invention generally relates to a semiconductor memory device including a plurality of memory banks, and more particularly to a nonvolatile semiconductor memory device which reduces the consumption current at the time of operation of each memory bank to stabilize the reading or writing operation of the semiconductor memory device.

2. Description of the Related Art

In recent years, the information society progresses quickly and the mass memory devices have come to be required of the information processing apparatus such as a multiple-purpose IC card incorporating various applications. Moreover, it is the tendency that the use of non-contact type IC cards increases, and the power supply to the IC card can be attained by using the microwave which results in the carrier signal of data to be transmitted. For this reason, there is a demand for the circuit configuration which can reduce the power consumption of internal circuits of the IC card as much as possible.

The power consumption of the IC card is divided roughly into the power consumption of the microprocessor and the power consumption of the memory device. Among these, the internal circuits of the microprocessor are always running, and the consumption current of the microprocessor is almost at a fixed level. Conventionally, by using a regulator, the power is easily supplied from the microwave to the microprocessor for the consumption at the fixed level.

On the other hand, as for the power consumption of the memory device, a series of internal circuits of the memory device start operation when the memory device is accessed. The waveform of the consumed electric current in the memory device does not become fixed. There is the tendency that the peak of the consumed electric current appears at the time of accessing the memory device.

Conventionally, in a DRAM, the memory chip is divided into a plurality of memory banks, and the operation is controlled by each memory-bank unit, thereby reducing the consumed electric current of the whole memory chip.

Moreover, a ferroelectric capacitor acts as a nonvolatile memory element, and it has the characteristics which enable the reading/writing operation of data at high speed. By using such characteristics, the nonvolatile memory device using a ferroelectric capacitor as a memory element (which is called the ferroelectric memory device) is put in practical use. The ferroelectric memory device is widely used for the memory device in the IC card.

FIG. 1A shows the fundamental composition of a memory bank of a conventional ferroelectric memory device, and FIG. 1B shows the waveform of the consumed electric current at the time of operation of the conventional ferroelectric memory device.

FIG. 2 shows the composition of a memory chip which includes a plurality of memory banks. The memory chip 100 includes a plurality of memory banks 10 and peripheral circuits 20. As shown in FIG. 2, the array of memory cells into which the memory chip 100 is divided per word line corresponds to one of the plurality of memory banks 10. The memory bank 10 shown in FIG. 2 is equivalent to the memory bank 10 shown in FIG. 1A.

In the conventional ferroelectric memory device of FIG. 1A, the plate-line driver (PL DRV) 12, the word-line driver (WL DRV) 14, and the sense amplifiers (S/A) 16 are arranged to the memory bank 10. Namely, a plurality of sense amplifiers are provided with respect to one memory block. For example, in the example of FIG. 1A, 32 sense amplifiers (S/A (32X)) are provided with respect to one memory bank.

FIG. 3 shows an example of the circuit configuration which generates a column select signal from the address signal and supplies the column select signal to the memory bank 10 of FIG. 1A.

As shown in FIG. 3, the column select signal generation circuit includes a column pre-decoder 30 and a plurality of column decoders (CDEC) 32-1, 32-2, . . . , 32-X. The number of the column decoders corresponds to the number of the columns of the memory bank 10. The column pre-decoder 30 receives the address signal. A plurality of cell blocks 34 each including the plurality of column decoders are also provided.

The column select signal which is generated by decoding of the address signal is sent to each of the column decoder 32 from the column pre-decoder 30. Each column decoder 32 sets up the value (0 or 1) of a corresponding bit of the received column select signal. The decoded data from each column decoder 32 is outputted as an individual column select signal. The individual column select signal indicates which column of the memory bank 10 at which the memory cell is located is selected. Namely, in the conventional ferroelectric memory device, the individual column select signal is intended to choose a specific one of the columns of the memory bank 10 where the data of the memory cell is accessed.

However, in the conventional ferroelectric memory device, the reading operation is performed for not only the selected cell but also the non-selected cells coupled to the shared word line and plate line that are the same as those of the selected cell. Therefore, in the conventional ferroelectric memory device, the plurality of sense amplifiers are activated at the time of reading of the data.

Thus, in the conventional ferroelectric memory device, once the memory bank 10 is activated, when accessing to each memory cell, all the plurality of sense amplifiers 16 are activated at the same time. For this reason, as shown in FIG. 1B, in the conventional ferroelectric memory device, there is the tendency that a pulse-like peak appears in the waveform of the consumed electric current at the time of the data reading operation.

As described above, in the conventional ferroelectric memory device, there is the tendency that a pulse-like peak appears in the waveform of the consumed electric current at the time of the data reading operation. Hence, there is the problem in that noise is caused by the drop or bumping of the power supply voltage due to the peak current at the time of the data reading operation in the conventional ferroelectric memory device.

Moreover, the fluctuation of the power supply voltage occurs at the time of starting of the sense amplifier activation which amplifies a small difference potential, and there is the problem in that a malfunction of the sense amplifier might be caused. Furthermore, the power supply voltage of the exterior of the memory chip may be affected by the fluctuation of the power supply voltage of the internal circuits of the memory chip, and there is the possibility that a malfunction of other circuits on the system including the memory chip, such as the IC card, takes place.

SUMMARY OF THE INVENTION

An object of the present invention is to provide an improved semiconductor memory device in which the above-described problems are eliminated.

Another object of the present invention is to provide a semiconductor memory device in which the sense amplifiers of different memory blocks in the memory bank are individually activated at different times to reduce the amount of the power consumption at one time, so that the reading/writing operation of the semiconductor memory device can be stabilized.

The above-mentioned objects of the present invention are achieved by a semiconductor memory device comprising: a memory bank which is divided into a plurality of memory blocks including a first memory block and a second memory block; a first sense amplifier control unit activating sense amplifiers connected with the first memory block in the memory bank, in response to a first activation signal; a second sense amplifier control unit activating sense amplifiers connected with the second memory block in the memory bank, in response to a second activation signal; and a signal control unit outputting the first activation signal and the second activation signal to the first sense amplifier control unit and the second sense amplifier control unit, separately from each other, the signal control unit outputting the second activation signal to the second sense amplifier control unit by delaying the first activation signal by a predetermined time after the outputting of the first activation signal.

The above-mentioned objects of the present invention are achieved by a semiconductor memory device comprising: a memory bank which is divided into a plurality of memory blocks including a first memory block and a second memory block; a first sense amplifier control unit activating sense amplifiers connected with the first memory block in the memory bank, in response to a first activation signal; a second sense amplifier control unit activating sense amplifiers connected with the second memory block in the memory bank, in response to a second activation signal; a signal control unit outputting the first activation signal and the second activation signal to the first sense amplifier control unit and the second sense amplifier control unit, separately from each other, the signal control unit outputting the second activation signal to the second sense amplifier control unit by delaying the first activation signal by a predetermined time after the outputting of the first activation signal; and a block select signal generating unit generating a first block select signal and a second block select signal based on an address signal that is supplied to the memory bank, the block select signal generating unit supplying the first block select signal and the second block select signal to the first sense amplifier control unit and the second sense amplifier control unit respectively.

The above-mentioned objects of the present invention are achieved by a semiconductor memory device comprising: a memory bank which is divided into a plurality of memory blocks including a first memory block and a second memory block; a first sense amplifier control unit activating sense amplifiers connected with the first memory block in the memory bank, in response to a first activation signal; a second sense amplifier control unit activating sense amplifiers connected with the second memory block in the memory bank, in response to a second activation signal; a signal control unit outputting the first activation signal and the second activation signal to the first sense amplifier control unit and the second sense amplifier control unit, separately from each other, the signal control unit outputting the second activation signal to the second sense amplifier control unit by delaying the first activation signal by a predetermined time after the outputting of the first activation signal; and a dummy cell block provided between the first memory block and the second memory block, the dummy cell block being connected to a dummy bit line which is grounded at one end, so that the dummy cell block serves to absorb noise caused when one of the first and second memory blocks is activated and the other of the first and second memory blocks is deactivated, wherein the signal control unit includes a timing control unit generating the second activation signal based on a logic level of a signal supplied from the dummy bit line of the dummy cell block.

In the semiconductor memory device of the present invention, the operation of the first sense amplifiers of the first memory block and the operation of the second sense amplifiers of the second memory block in the memory bank are separately controlled per block, and the amount of the power consumption at one time can be decreased. Therefore, the waveform of the consumed electric current at the time of the data reading/writing operation of the semiconductor memory device can be smoothed. Since the drop or bumping of the power supply voltage hardly takes place as in the conventional ferroelectric memory device, noise is not produced in the internal circuits of the semiconductor memory device.

Moreover, the power supply voltage of the internal circuits of the semiconductor memory device is stabilized, and it is possible to prevent the occurrence of a malfunction of other circuits of the system including the semiconductor memory device, such as the IC card.

Furthermore, when data is transmitted and received between the IC card and the terminal by the microwave or the like, the operation of the modulator circuit as well as the operation of the data communication is stabilized because no fluctuation of the power supply voltage of the internal circuits of the memory chip occurs.

Moreover, in the semiconductor memory device of the present invention, a dummy cell block may be incorporated between the memory blocks, and it is possible to reduce the interference of the memory blocks and prevent the occurrence of sensing miss of the cell data in the semiconductor memory device.

Furthermore, in the semiconductor memory device of the present invention, the potential of a well may be set up from the bit line through a well tap, and it is possible to stabilize the well potential. The back gate effect becomes fixed, and stable operation of the semiconductor memory device can be secured.

BRIEF DESCRIPTION OF THE DRAWINGS

Other objects, features and advantages of the present invention will become apparent from the following detailed description when read in conjunction with the accompanying drawings.

FIG. 2 is a diagram showing a memory chip including a plurality of memory banks.

FIG. 3 is a diagram showing the circuit configuration which generates a column select signal from the address signal and supplies the column select signal to the memory bank of FIG. 1A.

FIG. 5 is a diagram showing the circuit configuration which generates a block select signal from the address signal and supplies the block select signal to each memory block shown in FIG. 4A.

DETAILED DESCRIPTION OF PREFERRED EMBODIMENTS

A description will now be given of preferred embodiments of the present invention with reference to the accompanying drawings.

Figure 4A:
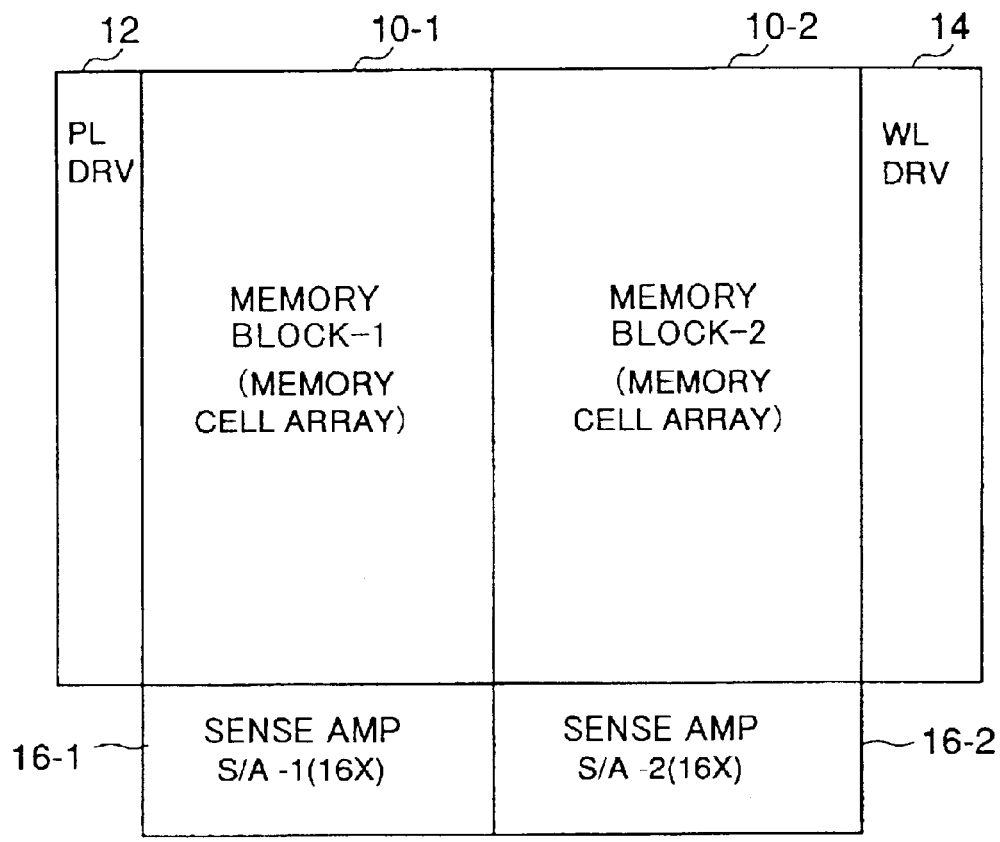
FIG. 4A and FIG. 4B are diagrams showing the fundamental composition of a memory block of the semiconductor memory device in a first preferred embodiment of the present invention.
Figure 4B:
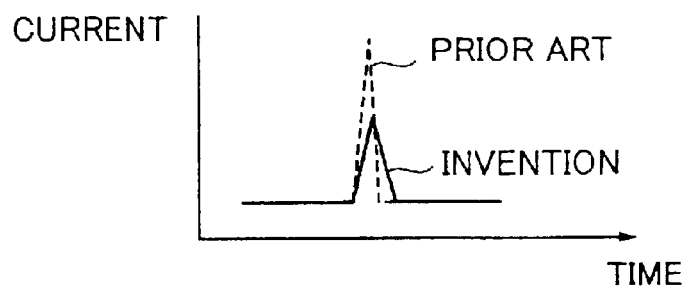

FIG. 4A and FIG. 4B show the fundamental composition of a memory block of the semiconductor memory device in a first preferred embodiment of the present invention.

The semiconductor memory device of the present embodiment is applied to a ferroelectric memory device which uses a ferroelectric capacitor as a memory element. The semiconductor memory device of FIG. 4A is capable of reducing the peak current in the data reading/writing operation by reducing the number of the sense amplifiers which start operation simultaneously in the same memory bank.

In order to realize this, the memory bank which is carved per word line is divided into a plurality of memory blocks. In the present embodiment, the two memory blocks: the memory block-1 and the memory block-2 are provided. Sense amplifier operation of each memory block is controlled independently by separately providing the sense amplifier control circuit 16-1 which controls the sense amplifiers connected to the memory cells of the memory block-1, and the sense amplifier control circuit 16-2 which controls the sense amplifiers connected to the memory cells of the memory block-2.

Preferably, in the present embodiment, one of the two memory blocks containing the memory cells being accessed is first activated and the other memory block is activated later.

Although the sense amplifiers of each of the plurality of blocks are controllable by providing the sense amplifier control circuits for the respective blocks, there are no judgment criteria as to which block is controlled to start operation with each sense amplifier control circuit itself. The column address signal which is supplied to the semiconductor memory device serves as the judgment criteria. Although the address signal may be supplied to each control circuit for this purpose, it is difficult to additionally provide the respective column address decoding circuits in the narrow memory core in practical applications.

In the semiconductor memory device of the present embodiment, the column address decoding circuits are provided separately, and each column address decoding circuit serves as a circuit that generates the block select signal from the column address signal which is supplied to the semiconductor memory device.

Such block select signal which is generated by each decoding circuit is supplied to a corresponding one of the sense amplifier control units. The block select signal, supplied to the corresponding one of the sense amplifier control units, allows the judgment criteria as to which block is controlled to start operation of the sense amplifiers, which will be described later with reference to FIG. 5.

In the present embodiment including the plurality of memory blocks, a second sense amplifier activation signal, which is supplied to the sense amplifiers of the subsequently activated memory block, is generated by delaying a first sense amplifier activation signal supplied to the sense amplifiers of the previously activated memory block.

In order to generate the delayed activation signal, a plurality of logical elements (which are, for example, inverters) connected in series are provided. The input logical element among the plurality of logical elements receives the first activation signal of the sense amplifiers of the previously activated memory block. The output signal from a desired one of the plurality of logical elements (the one of the plurality of logical elements is arbitrarily selected so as to obtain a suitable amount of delay) provides the delayed first activation signal. The trimming of the amount of delay is made possible by changing the selected one of the plurality of logical elements to another.

Figure 1A:
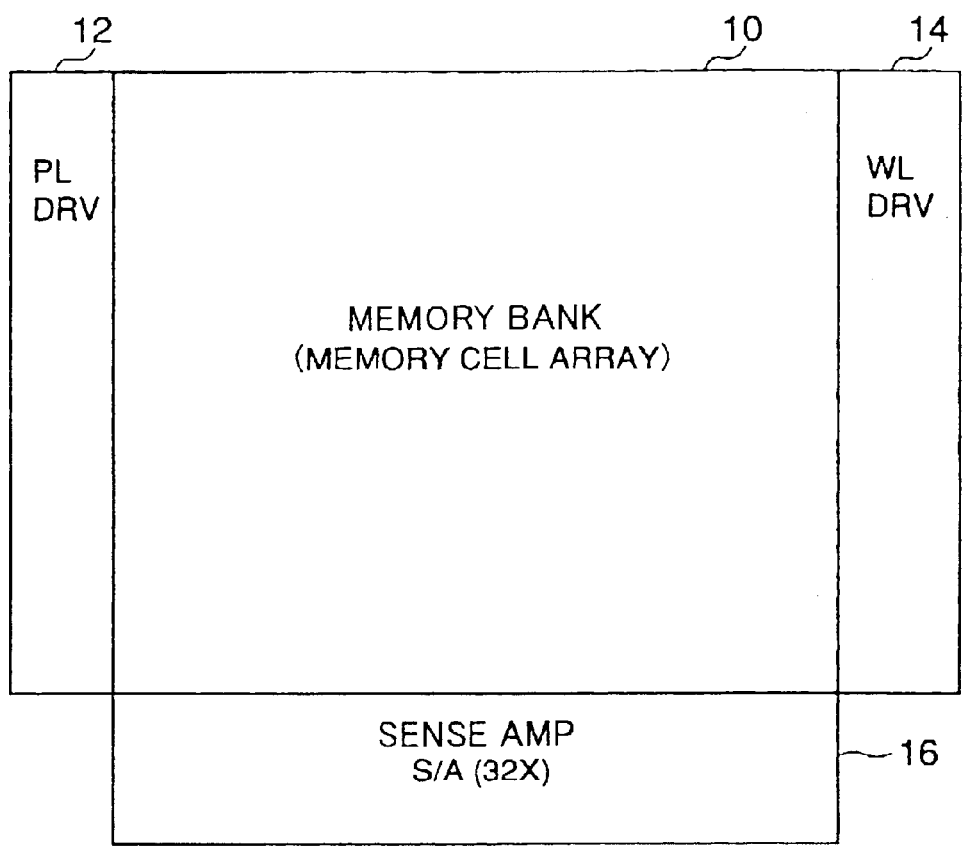
FIG. 1A and FIG. 1B are diagrams showing the fundamental composition of a memory bank of a conventional semiconductor memory device.
Figure 1B:
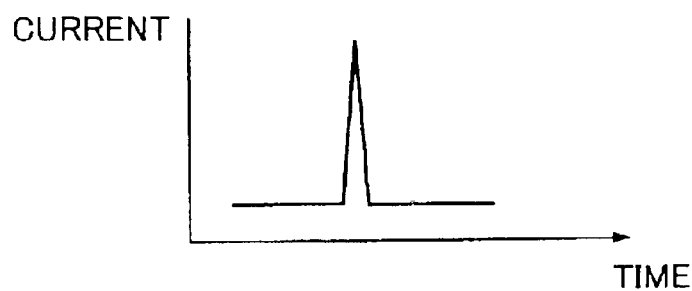

In the semiconductor memory device of the present embodiment, the memory bank is divided into a plurality of memory blocks similar to the conventional memory bank in FIG. 1A. The sense amplifiers of the respective memory blocks are activated, separately from each other. Hence, it is possible to reduce the number of the sense amplifiers which operate simultaneously in the semiconductor memory device.

Therefore, it is possible to prevent the consumed electric current of the memory from having the peak-current waveform as in the conventional semiconductor memory device. The semiconductor memory device of the present embodiment is useful because of the stabilization of the data reading/writing operation and the reduction of the peak current. In the semiconductor memory device of the present embodiment, the peak current can be reduced as shown in FIG. 4B.

In the semiconductor memory device of the present embodiment, each memory bank 10 is divided into a plurality of memory blocks from an operational standpoint. However, the memory bank 10 is physically an array of memory cells. Namely, the memory bank including the memory block 1 and the memory block 2 is a memory cell array in which a plurality of memory cells are arranged in rows and columns in a 2-dimensional matrix formation.

As shown in FIG. 4A, the memory bank is divided into the two memory blocks (the memory block 1 and the memory block 2), and the 16 sense amplifiers of the respective blocks operate at a time in a time-divisional manner. The word-line driver (WL DRV) 14 and the plate-line driver (PL DRV) 12 in the present embodiment which are associated with the memory bank are the same as those of the conventional semiconductor memory device of FIG. 1A.

Figure 6:
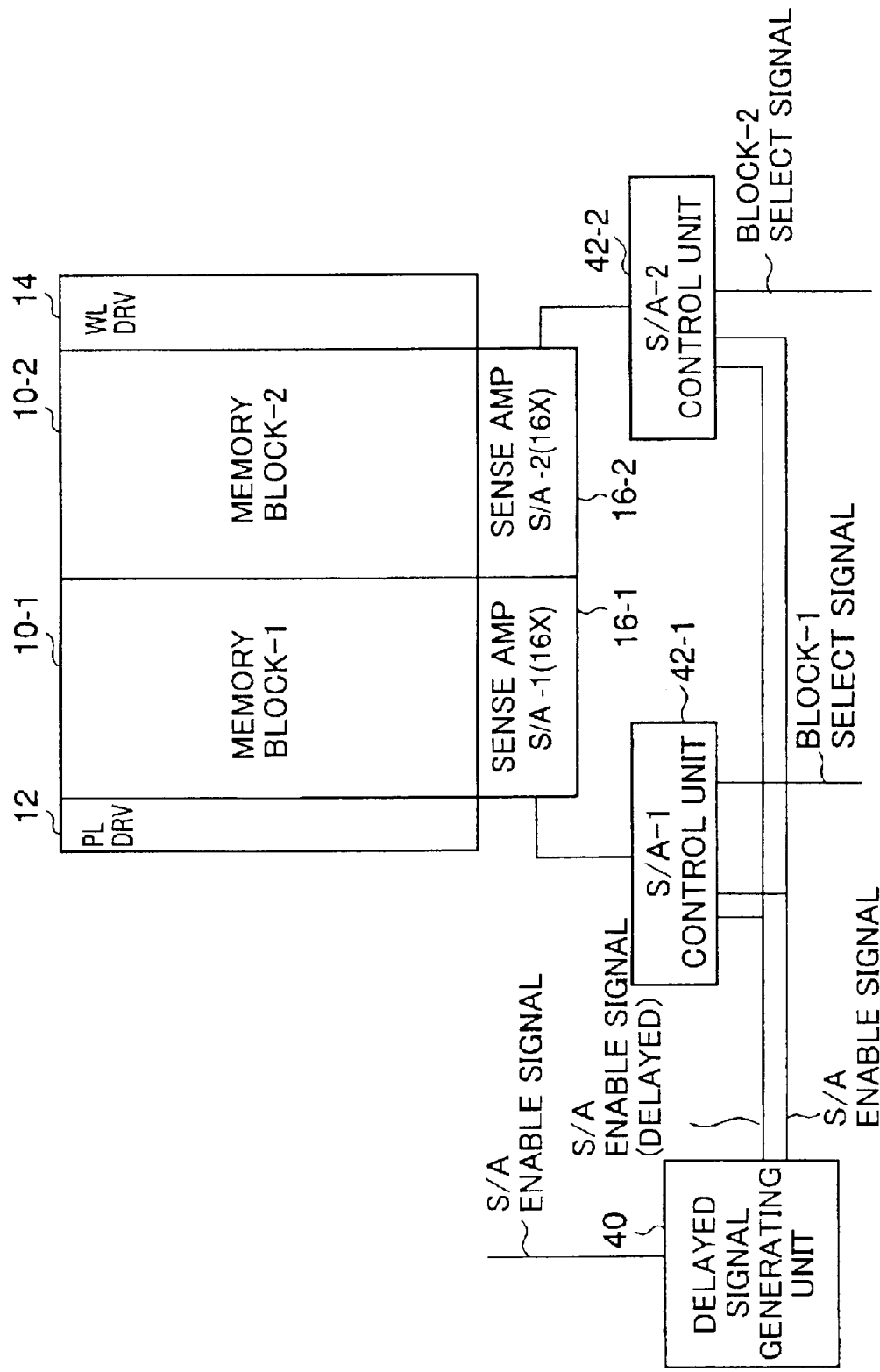
FIG. 6 is a block diagram of a sense amplifier control circuit in each memory block of the semiconductor memory device of the present embodiment.

FIG. 6 shows a sense amplifier control circuit in each memory block of the semiconductor memory device of the present embodiment.

As shown in FIG. 6, the sense amplifier control circuit comprises a sense-amplifier-1 (S/A-1) control unit 42-1, a sense-amplifier-2 (S/A-2) control unit 42-2, and a delayed signal generating unit 40. The control unit 42-1 performs activation control of the sense amplifiers of the memory block 1 in response to the block-1 select signal and the sense amplifier activation signal. The control unit 42-2 performs activation control of the sense amplifiers of the memory block 2 in response to the block-2 select signal and the sense amplifier activation signal. The delayed signal generating unit 40 outputs the sense amplifier activation signal and the delayed sense amplifier activation signal to the control unit 42-1 and the control unit 42-2, respectively.

The activation of the sense amplifiers (S/A-1) 16-1 of the memory block 1 and the activation of the sense amplifiers (S/A-2) 16-2 of the memory block 2 are controlled by the sense-amplifier-1 control unit 42-1 and the sense-amplifier-2 control unit 42-2 independently of each other. The control unit 42-1 and the control unit 42-2 are provided in a sense amplifier driver circuit.

Each of the sense-amplifier-1 control unit 42-1 and the sense-amplifier-2 control unit 42-2 is controlled in accordance with both the block select signal output by the block select decoder 36-1 or 36-2 and the sense amplifier activation signal output by the delayed signal generating unit 40. The delayed sense amplifier activation signal is generated by delaying the logic signal that is the same as the preceding sense amplifier activation signal. The differential time between the two sense amplifier activation signals serves to specify a difference in the starting time of activation between the sense amplifiers of the previously activated memory block and the sense amplifiers of the subsequently activated memory block.

There are some methods of generating the delayed sense amplifier activation signal that are applied to the delayed signal generating unit 40. For this purpose, a predetermined number of logical elements (for example, inverters) connected in series may be used. A description of the method of generating the delayed sense amplifier activation signal will be given later with reference to FIG. 9.

FIG. 5 shows the circuit configuration which generates a block select signal from the address signal and supplies the block select signal to each memory block shown in FIG. 4A.

In the conventional select-signal generation circuit shown in FIG. 3, choosing the column of the memory cells for data output is intended by decoding the address signal in each column decoder 32.

As shown in FIG. 5, in addition to the column select decoders 32 each generating the column select signal, there are provided the block select decoder 36-1 which generates the block-i select signal from the column address signal sent to each cell block 34, and the block select decoder 36-2 which generates the block-2 select signal from the column address signal sent to each cell block 34. The block-1 select signal and the block-2 select signal are made to correspond to the memory block 1 and the memory block 2 of the memory bank 10.

Figure 7:
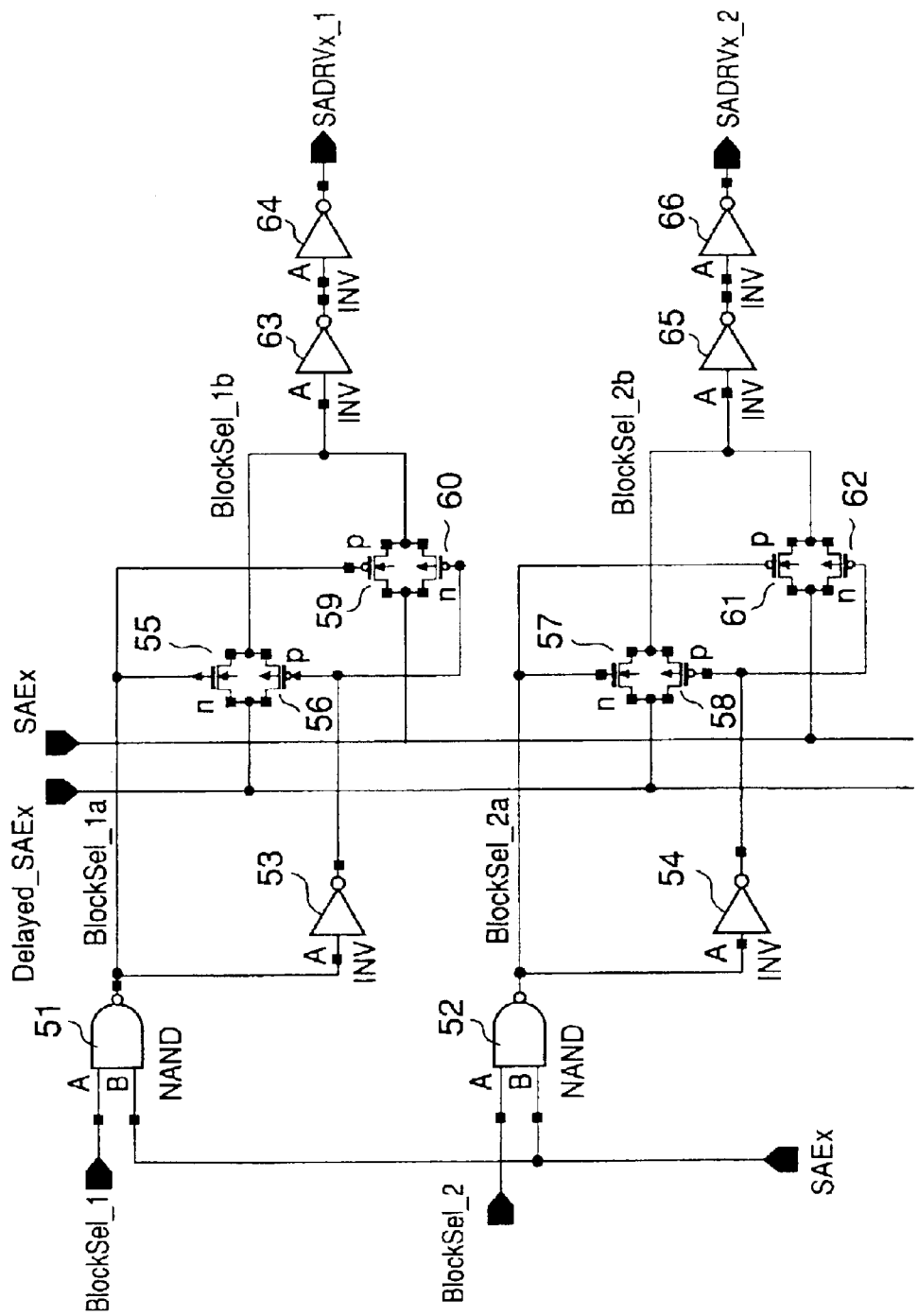
FIG. 7 is a circuit diagram of an example of the sense amplifier control circuit shown in FIG. 6.

FIG. 7 shows an example of the sense amplifier control circuit of FIG. 6. The sense amplifier control circuit of FIG. 7 is provided to control activation of each of the sense amplifiers 16-1 and the sense amplifiers 16-2 in FIG. 6.

The sense amplifier control circuit of FIG. 7 includes the NAND circuits 51 and 52, the inverters 53 and 54, the MOSFET transistors 55 and 56, the MOSFET transistors 57 and 58, the MOSFET transistors 59 and 60, the MOSFET transistors 61 and 62, and the inverters 63 and 64, and the inverters 65 and 66, which are connected as shown in FIG. 7.

The sense amplifier control circuit of FIG. 17 is controlled by the sense amplifier activation signal SAEx and block select signal BlockSel_x (x=1, 2). The sense amplifier control circuit performs the assignment of the sense amplifier activation signal SAEx and the delayed sense amplifier activation signal Delayed_SAEx, and separately supplies the sense amplifier activation signals to the sense amplifiers of the memory block 1 and the sense amplifiers of the memory block 2.

For example, when the memory cells accessed are in the memory block 1, the sense amplifier control circuit of FIG. 7 sets the block-1 select signal BlockSel_1 to HIGH level, and sets the block-2 select signal BlockSel_2 to LOW level.

When the sense amplifier activation signal SAEx is set to HIGH level, the signal SAEx is supplied to the sense amplifiers of the memory block 1.

At this time, the block-2 select signal BlockSel_2 is set to LOW level, instead of the signal SAEx, the sense amplifier activation signal Delayed_SAEx is supplied to the sense amplifiers of the memory block 2, instead of the signal SAEx. Hence, the sense amplifiers of the memory block 2 are activated subsequently from the stating time of activation of the sense amplifiers of the memory block 1.

Thus, in the present embodiment, the peak current is reduced by activating the sense amplifiers of the two memory blocks in a time-divisional manner.

Figure 8:
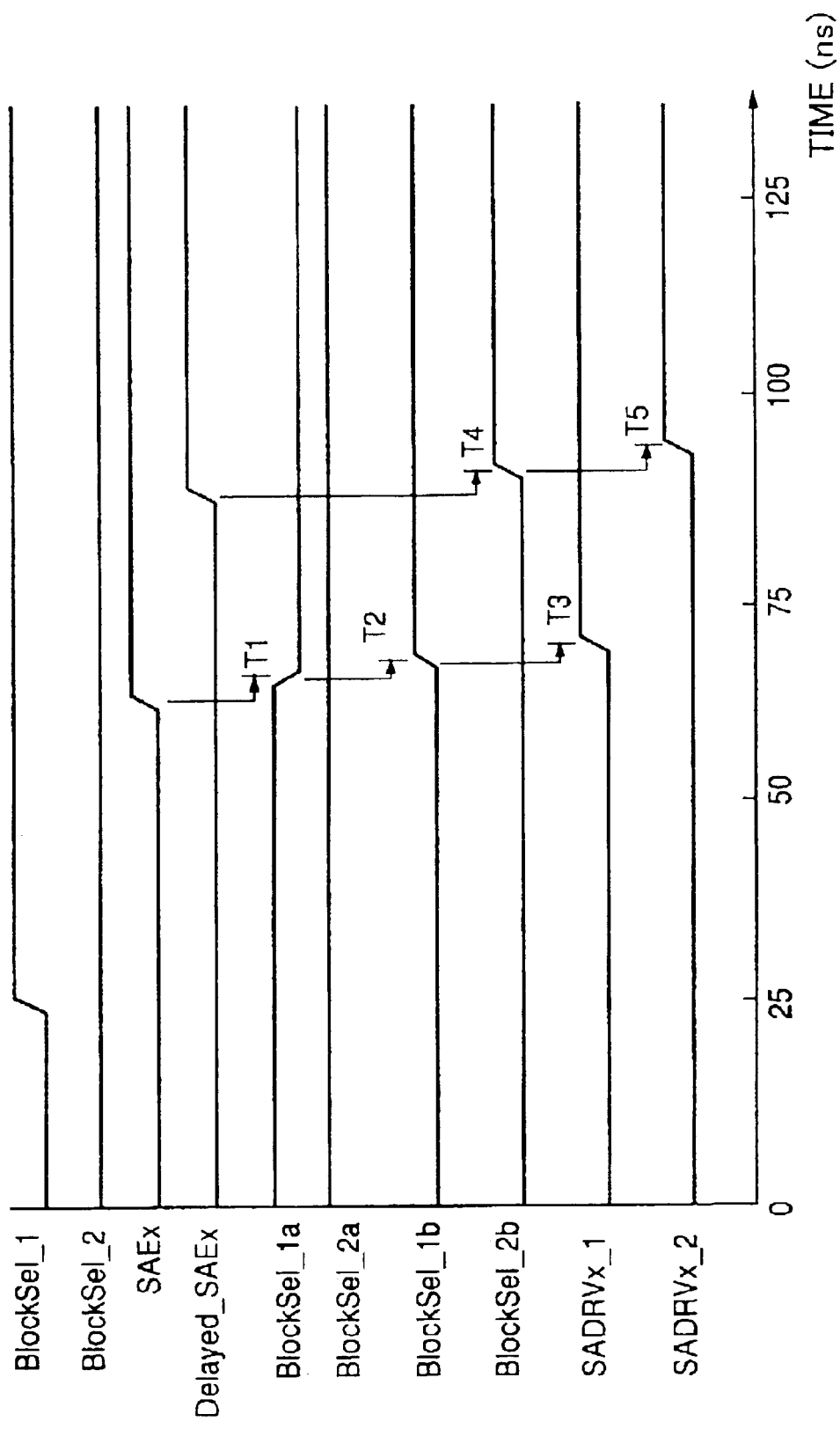
FIG. 8 is a timing chart for explaining operation of the sense amplifier control circuit shown in FIG. 7.

FIG. 8 is a timing chart for explaining operation of the sense amplifier control circuit of FIG. 7.

As shown in FIG. 8, when the rising edge of the sense amplifier activation signal SAEx occurs (T1), the falling edge of one of the block-1 select signal BlockSel_1a and the block-2 select signal BlockSel_2a occurs (T2). According to this timing, the rising edge of the sense amplifier activation signal SADRVx_1 occurs (T3), and the sense amplifiers of the memory block 1 are activated.

Similarly, when the rising edge of the delayed sense amplifier activation signal Delayed_SAEx which is delayed by a predetermined time from the time T1 occurs, the rising edge of the corresponding one of the block-2 select signal BlockSel_1b and the block-2 select signal BlockSel_2b occurs (T4). According to this timing, the rising edge of the sense amplifier activation signal SADRVx_2 occurs (T5), and the sense amplifiers of the memory block 2 are subsequently activated.

Figure 9:
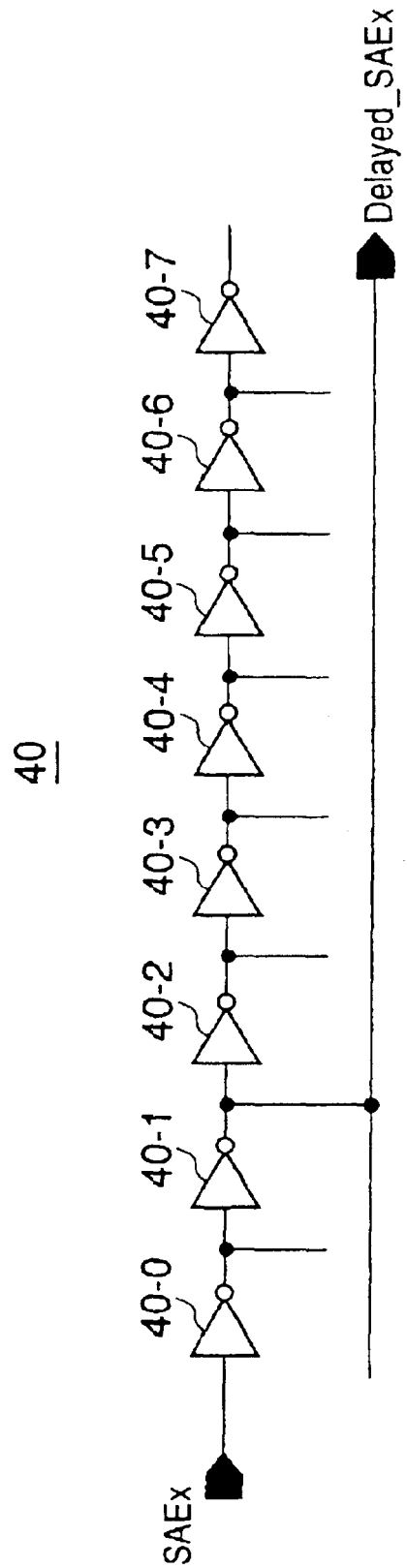
FIG. 9 is a circuit diagram of an example of the delayed signal generating unit shown in FIG. 6.

FIG. 9 shows an example of the delayed signal generating unit 40 of FIG. 6.

As described above, the delayed signal generating unit 40 sends out the sense amplifier activation signal and the delayed sense amplifier activation signal to the sense-amplifier-1 control unit 42-1 and the sense-amplifier-2 control unit 42-2, respectively, in order to supply the activation signals to the sense amplifiers of the two memory blocks in a time-divisional manner. It is assumed, in this case, that the memory block 1 is the previously activated block and the memory block 2 is the subsequently activated block. I As shown in FIG. 9, the delayed signal generating unit 40 of the present embodiment is a plurality of inverters 40-0 through 40-7 which are connected in series. The delayed sense amplifier activation signal Delayed_SAEx for the subsequently activated memory block is generated by delaying the sense amplifier activation signal SAEx sent to the sense amplifiers of the previously activated memory block.

The extraction point for extracting the delayed signal is provided at each of a plurality of connection lines between the plurality of inverters connected in series as shown in FIG. 9.

From a selected one of these extraction points in the delayed signal generating unit 40, the delayed sense amplifier activation signal Delayed_SAEx is taken out and it is sent out to the corresponding sense amplifier control unit.

Figure 10:
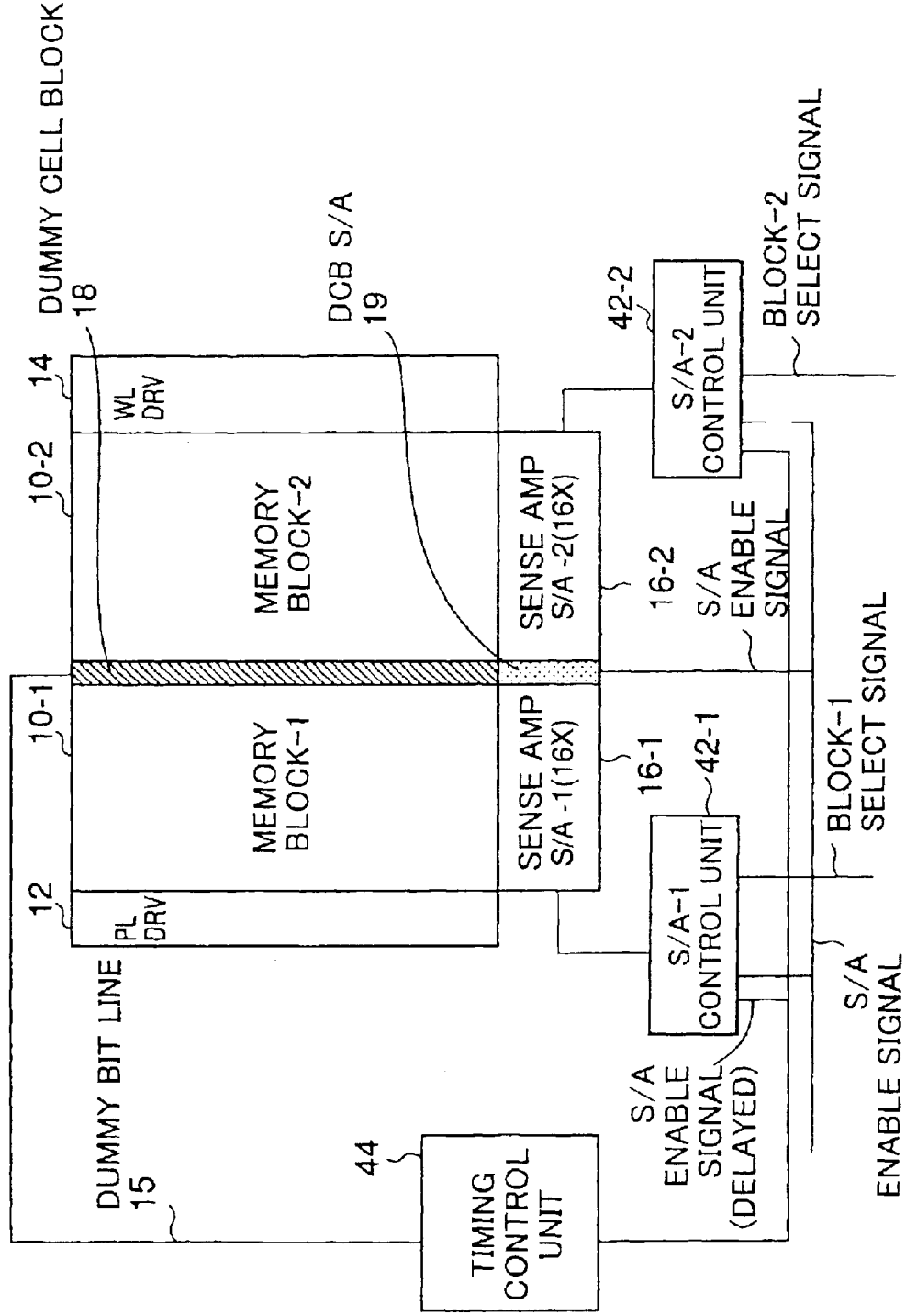
FIG. 10 is a block diagram of the semiconductor memory device in a second preferred embodiment of the present invention.
Figure 11:
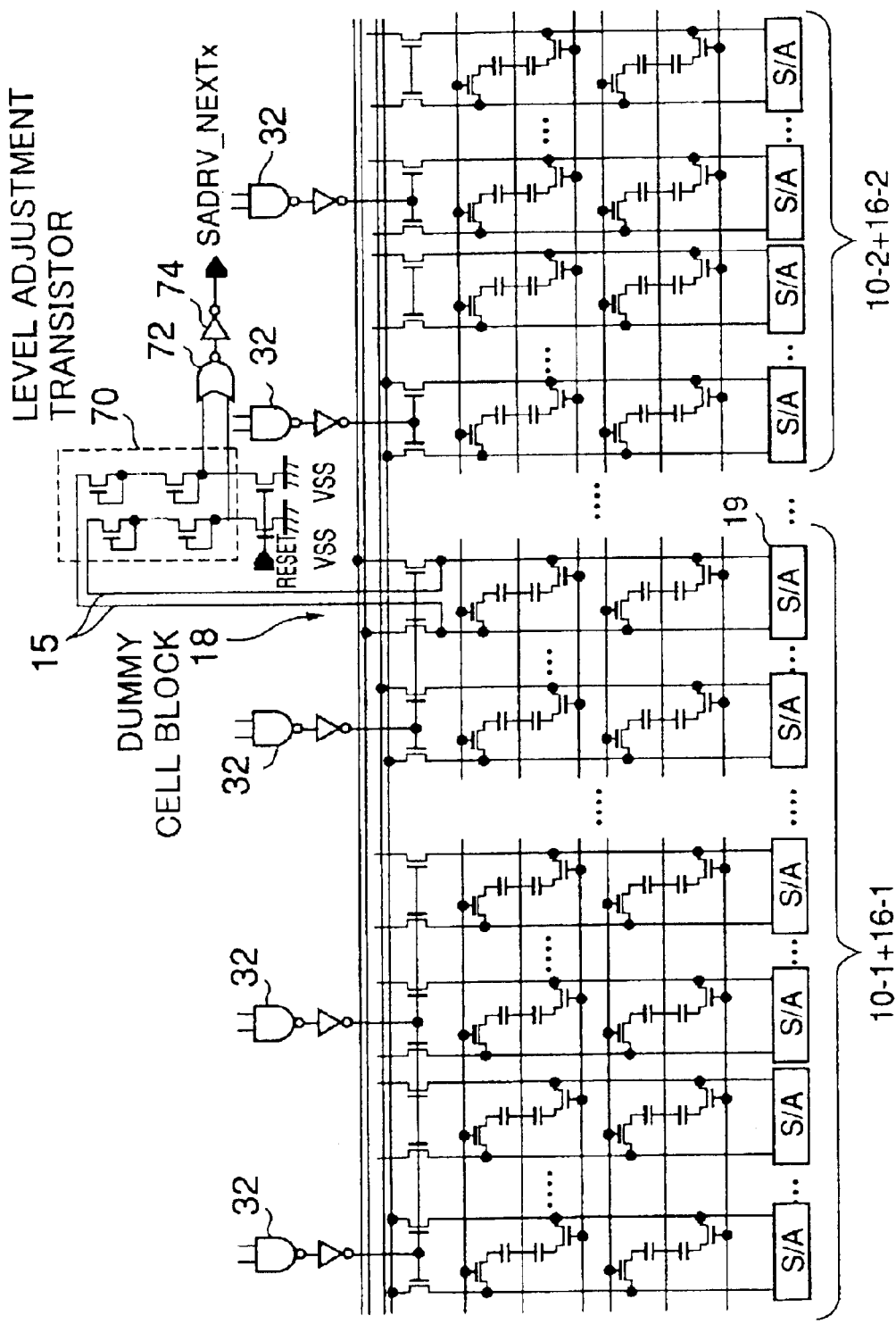
FIG. 11 is a circuit diagram of a portion of a timing control unit which generates a delayed activation signal to a sense amplifier control unit in the semiconductor memory device of FIG. 10.

The extraction points and the signal wires are prepared in the wiring process at the time of manufacture of the semiconductor memory device. Even after the bulk process to prepare the transistor etc. is finished, the trimming of the amount of delay is made possible by changing the selected one of the plurality of extraction points to another. Next, FIG. 10 shows the semiconductor memory device in a second preferred embodiment of the present invention. FIG. 11 shows a portion of a timing control unit which generates a delayed activation signal to each sense amplifier control unit of FIG. 10 in the present embodiment.

In the semiconductor memory device of FIG. 10, a dummy cell block and a dummy bit line (which is the same as the normal bit line) connected to the dummy cell block are provided. The lead wire is pulled from the dummy cell block as the dummy bit line, and it is connected to the input of a timing control unit. The timing control unit includes a plurality of logical elements connected in series. Each logical element of the timing control unit performs an operation wherein the logical element is turned ON when the applied voltage on the dummy bit line exceeds a certain threshold value.

Operation of the sense amplifiers of the previously activated block and operation of the sense amplifiers of the subsequently activated block are controllable in a time-divisional manner by sending the output signal of the timing control unit to the sense amplifier control unit corresponding to the subsequently activated block.

The self feedback of the timing of activation of the sense amplifiers is carried out based on the level of the actual bit line, and even when the operating characteristics of the memory block or the sense amplifiers vary depending on the degradation over an extended period of time, the data reading/writing operation of the semiconductor memory device is stabilized.

Since the starting of activation of the sense amplifiers differs between the memory blocks, the noise may take place on the bit line in the direction of the block sensed after the dummy bit line (or a pair of bit lines) provided between the two memory blocks.

In order to avoid the above problem, the dummy cell block is provided between the two memory blocks in the same memory bank as a role of the shield for the noise, and one end of the dummy bit line from the dummy cell block is grounded (the ground level Vss). Moreover, the stability of the circuit operation is raised by using the dummy bit line as the well tap in the middle of the semiconductor memory device where a potential change of the well of the semiconductor memory device is likely to occur.

As shown in FIG. 10 and FIG. 11, other composition of the semiconductor memory device of the present embodiment is essentially the same as that of the previous embodiment of FIG. 6. In the present embodiment, the timing control unit 44 generates the activation signal with respect to the sense amplifiers of the subsequently activated memory block by using the signal output from the dummy bit line 15 of the dummy cell block 18. The dummy cell block 18 has the same structure as the memory cells of the memory block 1 or the memory block 2, and a series of data reading/writing operations with the memory cells are performed in the same manner.

The dummy cell block 18 is different from the other memory blocks in that the bit line is pulled out from the dummy cell block 18 as the dummy bit line 15 so that the level of the bit line of the dummy cell block 18 can be detected. Moreover, the dummy cell block sense amplifiers (DCB_S/A) 19 connected to the dummy cell block 18 are provided additionally. However, the sense amplifiers 19 have the same structure as the sense amplifiers 16-1 or 16-2 of the memory block 1 or the memory block 2.

The output of the dummy bit line 15 is connected to an input logic element in the plurality of logic elements which is provided in the timing control unit 44, so that the level of the dummy bit line 15 can be detected.

The timing control unit 44 generates the activation signal with respect to the sense amplifiers of the subsequently activated memory block based on the level of the dummy bit line 15.

As shown in FIG. 11, the timing control unit 44 of the present embodiment generally includes the level adjustment transistors 70, the NAND circuit 72, and the inverter 74.

The inverter 74 serves to perform the switching operation of the ON/OFF for sending out the activation signal (SADRV_NEXTx) to the sense amplifier of the subsequently activated memory block.

In order to detect the level of the dummy bit line 15, the level adjustment transistor 70 includes a plurality of n-channel MOSFET transistors connected in series, each configured to have a diode connection to the dummy bit line 15.

The other edges of the plurality of n-channel transistors by which the series connection was carried out are grounded through the n-channel transistor used as the switch (the ground level Vss).

When resetting the timing control unit 44, the reset signal (RESET) is sent out to the gate of this grounded n-channel transistor.

In the semiconductor memory device of the present embodiment, the bit line which suited middle level when the sense amplifier was started, after the data was read from the memory cell is amplified by HIGH level (Vdd) or LOW level (Vss).

When it becomes the fixed value (which is determined by the threshold and the number of stages of the n-channel transistors, each n-channel transistor configured to have a diode connection to the dummy bit line) with this level, the inverter 74 which performs the switching operation of the ON/OFF is turned on. And the activation signal (SADRV_NEXTx) which activates the sense amplifiers of the subsequently-activated memory block is sent out.

The memory amplifier activation signal is formed by a plurality of signals which have the dummy bit line 15 top of the couple sent out, and the NAND circuit 72 and the inverter 74 take the logical addition of the plurality of signals and generate it as the activation signal. The same function can be obtained even when connecting the pulledout ends of the dummy bit lines 15 directly to the inverter 74 without providing the NAND circuit 72. However, in such case, the generation of the activation signal becomes less stable.

Moreover, in the embodiment of FIG. 11, at the time of manufacture of the semiconductor memory device, each n-channel transistor of the level adjustment transistor 70 configured to have a diode connection is prepared in the fixed number from the bulk process. The fixed number of the thus prepared transistors 70 are connected in series at the wiring process after the bulk process is performed. Therefore, in the wiring process, by changing the number of the n-channel transistors 70 which are connected in series, the level that is detectable with the level adjustment transistor 70 can be adjusted even after the end of the bulk process.

As described in the foregoing, In the semiconductor memory device of the present invention, the operation of the first sense amplifiers of the first memory block and the operation of the second sense amplifiers of the second memory block in the memory bank are separately controlled per block, and the amount of the power consumption at one time can be decreased. Therefore, the waveform of the consumed electric current at the time of the data reading/writing operation of the semiconductor memory device can be smoothed. Since the drop or bumping of the power supply voltage hardly takes place as in the conventional ferroelectric memory device, noise is not produced in the internal circuits of the semiconductor memory device.

Moreover, the power supply voltage of the internal circuits of the semiconductor memory device is stabilized, and it is possible to prevent the occurrence of a malfunction of other circuits of the system including the semiconductor memory device, such as the IC card.

Furthermore, when data is transmitted and received between the IC card and the terminal by the microwave or the like, the operation of the modulator circuit as well as the operation of the data communication is stabilized because no fluctuation of the power supply voltage of the internal circuits of the memory chip occurs.

Moreover, in the semiconductor memory device of the present invention, a dummy cell block may be incorporated between the memory blocks, and it is possible to reduce the interference of the memory blocks and prevent the occurrence of sensing miss of the cell data in the semiconductor memory device.

Furthermore, in the semiconductor memory device of the present invention, the potential of a well may be set up from the bit line through a well tap, and it is possible to stabilize the well potential. The back gate effect becomes fixed, and stable operation of the semiconductor memory device can be secured.

The present invention is not limited to the above-described embodiments, and variations and modifications may be made without departing from the scope of the present invention.

Further, the present invention is based on Japanese priority application No. 2002-069065, filed on Mar. 13, 2002, the entire contents of which are hereby incorporated by reference.

What is claimed is:

1. A semiconductor memory device comprising:
a memory bank which is divided into a plurality of memory blocks including a first memory block and a second memory block;
a first sense amplifier control unit activating sense amplifiers connected with the first memory block in the memory bank, in response to a first activation signal;
a second sense amplifier control unit activating sense amplifiers connected with the second memory block in the memory bank, in response to a second activation signal; and
a signal control unit outputting the first activation signal and the second activation signal to the first sense amplifier control unit and the second sense amplifier control unit, separately from each other, wherein the signal control unit is configured to transmit the second activation signal to the second sense amplifier control unit at a time which occurs after the signal control unit transmits the first activation signal to the first sense amplifier control unit.

2. The semiconductor memory device of claim 1 wherein the memory bank comprises a dummy cell block provided between the first memory block and the second memory block, the dummy cell block being connected to a dummy bit line which is grounded at one end, so that the dummy cell block serves to absorb noise caused when on of the first and second memory blocks is activated and the other of the first and second memory blocks is deactivated.

3. The semiconductor memory device of claim 1 wherein memory cells of the first memory block and memory cells of the second memory block are connected to a common word line.

4. The semiconductor memory device of claim 1 wherein the signal control unit includes a plurality of logical elements that are connected in series, the plurality of logical elements including an input logical element receiving the first activation signal and delaying the inputted first activation signal, and an arbitrarily selected one of the plurality of logical elements outputting the delayed first activation signal as the second activation signal.

5. The semiconductor memory device of claim 2 wherein the dummy bit line serves as a well tap in the middle of the semiconductor memory device where a potential change of a well of the semiconductor memory device may occur.

6. The semiconductor memory device of claim 1 wherein the semiconductor memory device is a nonvolatile memory device using a ferroelectric capacitor as a memory element.

7. A semiconductor memory device comprising:
a memory bank which is divided into a plurality of memory blocks including a first memory block and a second memory block;
a first sense amplifier control unit activating sense amplifiers connected with the first memory block in the memory bank, in response to a first activation signal;
a second sense amplifier control unit activating sense amplifiers connected with the second memory block in the memory bank, in response to a second activation signal;
a signal control unit outputting the first activation signal and the second activation signal to the first sense amplifier control unit and the second sense amplifier control unit separately from each other, wherein the signal control unit is configured to transmit the second activation signal to the second sense amplifier control unit at a time which occurs after the signal control unit transmits the first activation signal to the first sense amplifier control unit; and
a block select signal generating unit generating a first block select signal and a second block select signal based on an address signal that is supplied to the memory bank, the block select signal generating unit supplying the first block select signal and the second block select signal to the first sense amplifier control unit and the second sense amplifier control unit respectively.

8. The semiconductor memory device of claim 7 wherein the block select signal generating unit includes a pre-decoder, a first block select decoder, and a second block select decoder, the pre-decoder decoding the address signal, the first block select decoder decoding an output signal of the pre-decoder to output the first block select signal, and the second block select decoder decoding the output signal of the pre-decoder to output the second block select signal.

9. The semiconductor memory device of claim 7 wherein memory cells of the first memory block and memory cells of the second memory block are connected to a common word line.

10. The semiconductor memory device of claim 7 wherein the signal control unit includes a plurality of logical elements that are connected in series, the plurality of logical elements including an input logical element receiving the first activation signal and delaying the inputted first activation signal, and an arbitrarily selected one of the plurality of logical elements outputting the delayed first activation signal as the second activation signal.

11. A semiconductor memory device comprising:

a memory bank which is divided into a plurality of memory blocks including a first memory block and a second memory block;

a first sense amplifier control unit activating sense amplifiers connected with the first memory block in the memory bank, in response to a first activation signal;

a second sense amplifier control unit activating sense amplifiers connected with the second memory block in the memory bank, in response to a second activation signal;

a signal control unit outputting the first activation signal and the second activation signal to the first sense amplifier control unit and the second sense amplifier control unit separately from each other, wherein the signal control unit is configured to transmit the second activation signal to the second sense amplifier control unit at a time which occurs after the signal control unit transmits the first activation signal to the first sense amplifier control unit; and a dummy cell block provided between the first memory block and the second memory block, the dummy cell block being connected to a dummy bit line which is grounded at one end, so that the dummy cell block serves to absorb noise caused when one of the first and second memory blocks is activated and the other of the first and second memory blocks is deactivated, wherein the signal control unit includes a timing control unit generating the second activation signal based on a logic level of a signal supplied from the dummy bit line of the dummy cell block.

12. The semiconductor memory device of claim 11, wherein the timing control unit includes a level adjustment circuit having a plurality of n-channel transistors connected in series, each configured to have a diode connection to the dummy bit line, an input transistor of the plurality of n-channel transistors being connected to the dummy bit line of the dummy cell block, an output transistor of the plurality of n-channel transistors being grounded.

13. The semiconductor memory device of claim 11 wherein memory claims of the first memory block and memory cells of the second memory block are connected to a common word line.

* * * * *